(12) United States Patent
Oyama et al.

(10) Patent No.: US 10,483,928 B2
(45) Date of Patent: *Nov. 19, 2019

(54) POWER AMPLIFICATION MODULE

(71) Applicant: Murata Manufacturing Co., Ltd., Kyoto (JP)

(72) Inventors: Yasushi Oyama, Kyoto (JP); Takayuki Tsutsui, Kyoto (JP); Kazuhito Nakai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/926,165

(22) Filed: Mar. 20, 2018

(65) Prior Publication Data
US 2018/0212578 A1 Jul. 26, 2018

Related U.S. Application Data

(63) Continuation of application No. 15/365,092, filed on Nov. 30, 2016, now Pat. No. 9,954,504.

(30) Foreign Application Priority Data

Dec. 2, 2015 (JP) .................................. 2015-236095

(51) Int. Cl.
H03G 1/00 (2006.01)
H03F 3/72 (2006.01)
(Continued)

(52) U.S. Cl.
CPC ............. *H03G 1/0094* (2013.01); *H03F 1/56* (2013.01); *H03F 3/19* (2013.01); *H03F 3/213* (2013.01);
(Continued)

(58) Field of Classification Search
USPC ............................... 330/295, 124 R, 84, 286
See application file for complete search history.

(56) References Cited

U.S. PATENT DOCUMENTS 6,298,244 B1 10/2001 Boesch et al.
8,461,931 B1 6/2013 Bayruns et al.
(Continued)

FOREIGN PATENT DOCUMENTS

JP 2012-527186 A 11/2012
WO 2010/132618 A1 11/2010

*Primary Examiner* — Hieu P Nguyen
(74) *Attorney, Agent, or Firm* — Pearne & Gordon LLP

(57) ABSTRACT

A power amplification module includes a first input terminal that receives a first transmit signal in a first frequency band, a second input terminal that receives a second transmit signal in a second frequency band having a narrower transmit/receive frequency interval than the first frequency band, a first amplification circuit that receives and amplifies the first transmit signal to produce a first amplified signal and outputs the first amplified signal, a second amplification circuit that receives and amplifies the second transmit signal to produce a second amplified signal and outputs the second amplified signal, a third amplification circuit that receives and amplifies the first or second amplified signal to produce an output signal and outputs the output signal, and an attenuation circuit located between the second input terminal and the second amplification circuit and configured to attenuate a receive frequency band component of the second frequency band.

20 Claims, 2 Drawing Sheets

(51) Int. Cl.
*H03F 3/24* (2006.01)
*H03F 3/19* (2006.01)
*H03F 3/213* (2006.01)
*H03F 1/56* (2006.01)

(52) U.S. Cl.
CPC ............ *H03F 3/245* (2013.01); *H03F 3/72* (2013.01); *H03F 2200/111* (2013.01); *H03F 2200/165* (2013.01); *H03F 2200/222* (2013.01); *H03F 2200/318* (2013.01); *H03F 2200/387* (2013.01); *H03F 2203/7209* (2013.01); *H03G 2201/106* (2013.01); *H03G 2201/40* (2013.01)

(56) References Cited

U.S. PATENT DOCUMENTS

| | | | |
|---|---|---|---|
| 9,106,416 B2* | 8/2015 | Mikhemar | ............... H04B 1/18 |
| 9,608,673 B2* | 3/2017 | Park | ....................... H04B 1/006 |
| 2009/0201084 A1 | 8/2009 | See et al. | |
| 2010/0291888 A1 | 11/2010 | Hadjichristos | |
| 2011/0158081 A1 | 6/2011 | Wang et al. | |
| 2014/0327483 A1* | 11/2014 | Balteanu | ................. H03F 3/245 |
| | | | 330/295 |
| 2016/0190995 A1 | 6/2016 | Penticoff | |

* cited by examiner

POWER AMPLIFICATION MODULE

This is a continuation of U.S. patent application Ser. No. 15/365,092 filed on Nov. 30, 2016 which claims priority from Japanese Patent Application No. 2015-236095 filed on Dec. 2, 2015. The contents of these applications are incorporated herein by reference in their entireties.

BACKGROUND OF THE DISCLOSURE

1. Field of the Disclosure

The present disclosure relates to a power amplification module.

2. Description of the Related Art

Mobile communication devices such as mobile phones employ a power amplifier module to amplify power of a radio-frequency (RF) signal to be transmitted to a base station. For example, Japanese Unexamined Patent Application Publication (Translation of PCT Application) No. 2012-527186 discloses a power amplifier module that supports multiple modes and multiple bands.

With the recent increase in the number of frequency bands available for mobile communication devices, a frequency band with a relatively narrow transmit/receive frequency interval is sometimes used. In connection with this, the power amplifier module disclosed in Japanese Unexamined Patent Application Publication (Translation of PCT Application) No. 2012-527186 has the following problem: when amplifying a signal in a transmit frequency band, the power amplifier module also amplifies noise that overlaps with a receive frequency band since the noise is superimposed on the signal. In a frequency band with a relatively narrow transmit/receive frequency interval, in particular, accordingly, the reception sensitivity is low.

BRIEF SUMMARY OF THE DISCLOSURE

Accordingly, it is an object of the present disclosure to provide a power amplification module that prevents or reduces the occurrence of receive frequency band noise in a frequency band with a narrow transmit/receive frequency interval.

A power amplification module according to preferred embodiments of the present disclosure includes a first input terminal that receives a first transmit signal in a first frequency band, a second input terminal that receives a second transmit signal in a second frequency band having a narrower transmit/receive frequency interval than the first frequency band, a first amplification circuit that receives and amplifies the first transmit signal to produce a first amplified signal and that outputs the first amplified signal, a second amplification circuit that receives and amplifies the second transmit signal to produce a second amplified signal and that outputs the second amplified signal, a third amplification circuit that receives and amplifies one of the first amplified signal and the second amplified signal to produce an output signal and that outputs the output signal, and an attenuation circuit located between the second input terminal and the second amplification circuit and configured to attenuate a receive frequency band component of the second frequency band.

According to preferred embodiments of the present disclosure, a power amplification module that prevents or reduces the occurrence of receive frequency band noise in a frequency band with a narrow transmit/receive frequency interval may be achieved.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
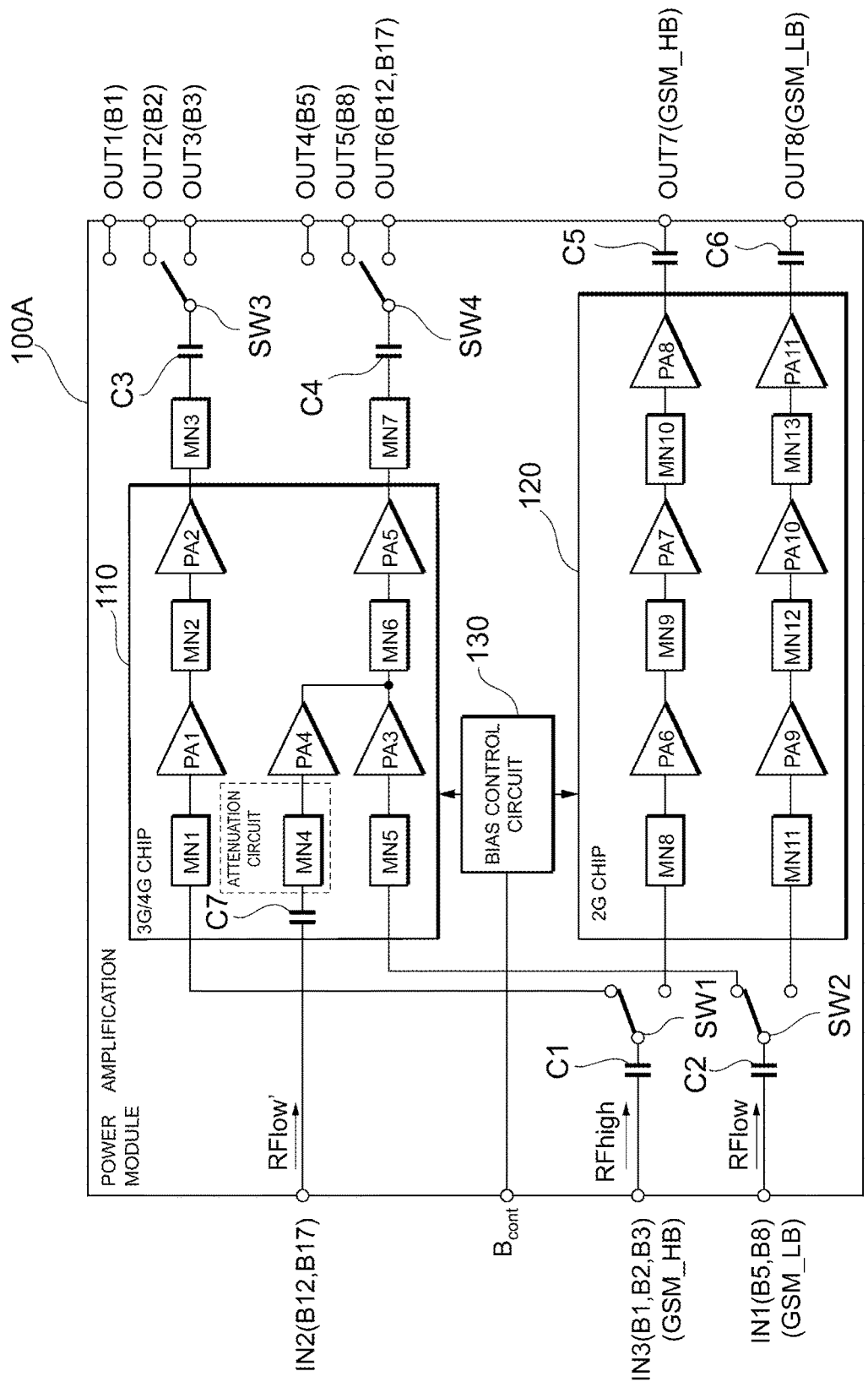
FIG. 1 illustrates a configuration of a power amplification module according to an embodiment of the present disclosure.

Embodiments of the present disclosure will be described in detail hereinafter with reference to the drawings. The same or similar elements are denoted by the same reference numerals and are not redundantly described herein.

FIG. 1 illustrates a configuration of a power amplification module 100A according to an embodiment of the present disclosure. The power amplification module 100A has a function of amplifying power of RF signals of a plurality of communication standards on a plurality of frequency bands. The power amplification module 100A is included in a transmit unit located in a user terminal, such as a mobile phone, for processing a transmit signal to be transmitted to a base station. Although not illustrated in FIG. 1, the user terminal also includes a receive unit for processing a receive signal received from the base station. The transmit unit and the receive unit are provided as a single communication unit, for example.

The power amplification module 100A supports a plurality of communication standards (modes). In the example illustrated in FIG. 1, multiple modes including the second generation mobile communication system (2G), third generation mobile communication system (3G), and fourth generation mobile communication system (4G) modes are supported. However, the communication standards are not limited to those modes. For example, multiple modes including the 3G, 4G and fifth generation mobile communication system (5G) modes may be supported. In addition, the power amplification module 100A may not necessarily support three communication standards, and may support one or more than one communication standard.

The power amplification module 100A also supports a plurality of frequency ranges (or bands). In FIG. 1, seven frequency bands, namely, B1 (transmit frequency band: 1920 to 1980 MHz), B2 (transmit frequency band: 1850 to 1910 MHz), B3 (transmit frequency band: 1710 to 1785 MHz), B5 (transmit frequency band: 824 to 849 MHz), B8 (transmit frequency band: 880 to 915 MHz), B12 (transmit frequency band: 699 to 716 MHz), and B17 (transmit frequency band: 704 to 716 MHz), are depicted as the 3G/4G frequency bands, by way of example but not limitation. In this embodiment, three frequency bands, namely, the B1, B2, and B3 bands, are referred to as high band, and four frequency band, namely, the B5, B8, B12, and B17 bands, are referred to as low band. Within the low band, the B12 and B17 bands are frequency bands with a relatively narrow transmit/receive frequency interval. The transmit/receive frequency interval is an interval between the center frequency of the transmit frequency band (in the B12 band, 699 to 716 MHz) and the center frequency of the receive frequency band (in the B12 band, 729 to 746 MHz). For example, the transmit/receive frequency intervals of the B12 and B17 bands are narrower than the transmit/receive frequency interval of the B5 or B8 band. In addition, as exemplary 2G frequency bands, GSM (registered trademark) (global system for mobile communications) high band (GSM_HB) and low band (GSM_LB) are depicted.

Next, a description will be given of individual components of the power amplification module 100A. As illustrated in FIG. 1, the power amplification module 100A includes a 3G/4G chip 110, a 2G chip 120, a bias control circuit 130, matching networks (MNs) MN3 and MN7, switch elements SW1 to SW4, and capacitors C1 to C6.

The 3G/4G chip 110 amplifies and outputs 3G/4G RF signals supplied from input terminals IN1 to IN3. The 2G chip 120 amplifies and outputs 2G RF signals supplied from the input terminals IN1 and IN3. The configuration of the 3G/4G chip 110 and the 2G chip 120 will be described in detail below.

The bias control circuit 130 generates a bias current in accordance with a control signal Bcont inputted from outside the power amplification module 100A, and supplies the bias current to power amplification circuits PA1 to PA5 in the 3G/4G chip 110 or power amplification circuits PA6 to PA11 in the 2G chip 120.

Each of the matching networks (MN) MN3 and MN7 is a circuit for matching the output impedance of a circuit located upstream thereof to the input impedance of a circuit located downstream thereof, and is implemented using a capacitor and an inductor. Matching networks MN1, MN2, MN4 to MN6, and MN8 to MN13, described below, also have a similar configuration.

The switch elements SW1 and SW2 supply transmit signals inputted to the input terminals IN3 and IN1, respectively, in accordance with the communication standards of the transmit signals so as to supply the transmit signals to the 3G/4G chip 110 if the transmit signals are 3G/4G signals and supply the transmit signals to the 2G chip 120 if the transmit signals are 2G signals. The switch elements SW1 and SW2 can be mounted on a substrate of the power amplification module 100A by silicon-on-insulator (SOI), for example. This allows integration of input terminals for 2G and 3G/4G transmit signals. Accordingly, the number of terminals can be reduced compared to when input terminals individually corresponding to communication standards are provided.

The switch elements SW3 and SW4 respectively output amplified transmit signals to any one of output terminals OUT1 (B1), OUT2 (B2), and OUT3 (B3) for the respective frequency bands and to any one of output terminals OUT4 (B5), OUT5 (B8), and OUT6 (B12, B17) for the respective frequency bands in accordance with the frequency bands of the transmit signals. As illustrated in FIG. 1, a single output terminal may be provided for each frequency band or a single output terminal may be shared by several frequency bands.

The capacitors C1 to C6 remove the direct-current (DC) components from the transmit signals. A capacitor C7, described below, also performs a similar operation.

Next, a description will be given of the configuration of the 3G/4G chip 110 and the 2G chip 120. The 3G/4G chip 110 includes the power amplification circuits PA1 to PA5, the matching networks MN1, MN2, and MN4 to MN6, and the capacitor C7. The 2G chip 120 includes the power amplification circuits PA6 to PA11 and the matching networks MN8 to MN13.

Each of the power amplification circuits PA1 to PA11 is a circuit for amplifying a transmit signal, and is constituted by a transistor for amplification. The transistor for amplification is a bipolar transistor such as a heterojunction bipolar transistor (HBT). A field-effect transistor (a metal-oxide-semiconductor field effect transistor (MOSFET)) may be used as a transistor for amplification.

In this embodiment, the 3G/4G chip 110 is constituted by three amplification paths, namely, an amplification path for the high band, an amplification path for the low band, and an amplification path for a specific band within the low band. The 2G chip 120 is constituted by two amplification paths, namely, an amplification path for the high band and an amplification path for the low band. Specifically, the power amplification circuits PA1 and PA2 are disposed in the amplification path for the 3G/4G high band, the power amplification circuits PA3 and PA5 are disposed in the amplification path for the 3G/4G low band, and the power amplification circuits PA4 and PA5 are disposed in the amplification path for the specific band within the 3G/4G low band. Each of the amplification paths has two stages. The power amplification circuits PA6 to PA8 are disposed in the amplification path for the 2G high band, and the power amplification circuits PA9 to PA11 are disposed in the amplification path for the 2G low band. Each of the amplification paths has three stages.

The amplification of transmit signals in the 3G/4G chip 110 will now be described in detail by way of example.

When a transmit signal RFhigh in the 3G/4G high band (for example, B1, B2, or B3) is inputted from the input terminal IN3, the transmit signal RFhigh is supplied to the amplification path for the high band in the 3G/4G chip 110 by using the switch element SW1 via the capacitor C1. The signal is amplified by the power amplification circuit PA1 in the initial stage (drive stage) via the matching network MN1. The amplified signal is amplified by the power amplification circuit PA2 in the second stage (power stage) via the matching network MN2, and the amplified signal is outputted to the matching network MN3.

On the other hand, when a transmit signal RFlow (first transmit signal) in the 3G/4G low band (first frequency band) (for example, B5 or B8) is inputted from the input terminal IN1 (first input terminal), the transmit signal RFlow is supplied to the amplification path for the low band in the 3G/4G chip 110 by using the switch element SW2 via the capacitor C2. The signal is amplified by the power amplification circuit PA3 (first amplification circuit) in the drive stage via the matching network MN5. The amplified signal (first amplified signal) is amplified by the power amplification circuit PA5 (third amplification circuit) in the power stage via the matching network MN6, and the amplified signal (output signal) is outputted to the matching network MN7.

Next, a description will be given of the case where a transmit signal in a frequency band (second frequency band) (which will be described hereinafter in the context of B12 and B17, by way of example) with a transmit/receive frequency interval narrower than the transmit/receive frequency intervals for the other low bands (for example, B5 and B8) within the 3G/4G low band is inputted.

A transmit signal RFlow' (second transmit signal) in the frequency band B12 or B17 is inputted from the input terminal IN2 (second input terminal), which is different from the input terminal IN1 for the 3G/4G low band. The transmit signal RFlow' is then amplified by the power amplification circuit PA4 (second amplification circuit) in the drive stage via the capacitor C7 and the matching network MN4 (attenuation circuit). The amplified signal (second amplified signal) is amplified by the power amplification circuit PA5 (third amplification circuit) in the power stage via the matching network MN6, and the amplified signal (output signal) is outputted to the matching network MN7. In the manner described above, the 3G/4G chip 110 is provided with the input terminal IN2, the matching network MN4, and the power amplification circuit PA4, which are specific to the transmit signal RFlow', separate from the input terminal IN1 and the power amplification circuit PA3 for the other bands covered by the low band.

Since the frequency bands B12 and B17 have narrower transmit/receive frequency intervals (for example, approximately 30 MHz), noise included in the transmit signal RFlow' may overlap with the receive frequency band. The noise is amplified, which may greatly affect a receive signal, leading to a reduction in reception sensitivity. To address this issue, it is highly desirable to reduce noise in the amplification of a transmit signal in such a frequency band.

One conceivable method for reducing noise is to reduce the base resistance of an HBT, that is, to increase the emitter area of the HBT. On the contrary, an increase in the emitter area of the HBT accompanies a reduction in gain. This results in insufficient gain for a transmit signal RFlow (for example, 900 MHz) in a frequency band different from the transmit signal RFlow' (for example, 700 MHz) if power amplification for the low band is implemented by using a single power amplification circuit. In this embodiment, in contrast, separate power amplification circuits are provided for the drive stage, which may achieve an optimum design for the respective frequency bands. Specifically, the power amplification circuit PA4 can have a relatively large emitter area for noise reduction, whereas the power amplification circuit PA3 can have a relatively small emitter area for the maintenance of the desired gain. This configuration can prevent, or reduce, noise in the power amplification of the transmit signal RFlow' while keeping the desired gain level for the power amplification of the transmit signal RFlow.

In this embodiment, furthermore, it is possible to separately design the matching network MN5 (for the transmit signal RFlow) and the matching network MN4 (for the transmit signal RFlow'). Thus, the difficulty in performing impedance matching of transmit signals which cover a wide range of approximately 700 MHz to 900 MHz by using a single matching network can be avoided. In addition, the matching network MN4 can be adapted to function as an attenuation circuit. That is, the matching network MN4 has a function of attenuating the receive frequency band components of the transmit signal RFlow', which may result in prevention or reduction of the occurrence of noise and result in further reduction of the effect of noise on a receive signal.

As described above, the power amplification module 100A provides prevention or reduction of the occurrence of noise in a frequency that overlaps with the receive frequency band during amplification of the transmit signal RFlow'.

When the transmit signal RFlow' is inputted from the input terminal IN2, the switch element SW2 can be configured to connect to the amplification path for the low band in the 2G chip 120 or to go to an undefined state to electrically disconnect the input terminal IN1. This configuration can prevent noise from being supplied from the input terminal IN1 to the power amplification circuit PA5 in the 3G/4G chip 110 during amplification of the transmit signal RFlow'.

In this embodiment, furthermore, the 3G/4G chip 110 can be implemented as a monolithic microwave integrated circuit (MMIC) and can be configured such that the capacitor C7 is incorporated in the 3G/4G chip 110. This configuration can reduce the number of mounted components.

The amplification paths included in the 2G chip 120, for both the high band and the low band, are each configured such that a power amplification circuit in the third stage is added to the configuration of the amplification path for the 3G/4G high band. Specifically, a transmit signal GSM_LB (third transmit signal) in the 2G low band is inputted from the input terminal IN1 and is then distributed to the amplification path for the low band in the 2G chip 120 by using the switch element SW2. Then, the transmit signal GSM_LB is amplified by the power amplification circuit PA9 (fourth amplification circuit) via the matching network MN11, amplified by the power amplification circuit PA10 via the matching network MN12, and amplified by the power amplification circuit PA11 via the matching network MN13. The amplification path for the 2G high band is similar to the amplification path for the 2G low band and thus is not described in detail herein.

In FIG. 1, the amplification paths in the 3G/4G chip 110 are each constituted by two stages of power amplification circuits, and the amplification paths in the 2G chip 120 are each constituted by three stages of power amplification circuits. The number of stages of power amplification circuits in each chip is not limited to that described above, and each chip may include one or two stages of power amplification circuits or may include more than two stages of power amplification circuits.

Figure 2:
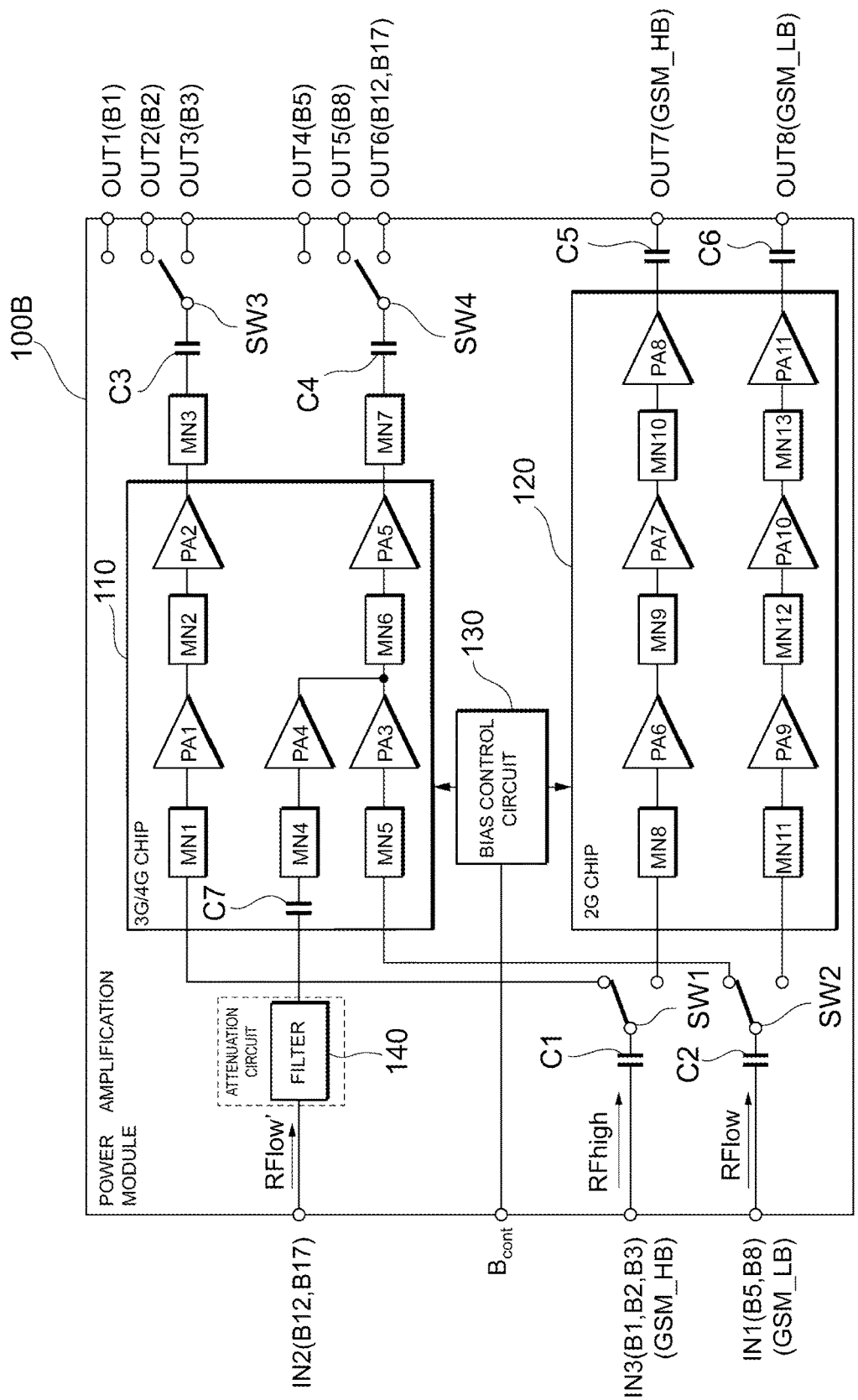
FIG. 2 illustrates a configuration of a power amplification module according to another embodiment of the present disclosure.

FIG. 2 illustrates a configuration of a power amplification module 100B according to another embodiment of the present disclosure. Elements that are the same as or similar to those of the power amplification module 100A are denoted by the same numerals and are not described herein. In this embodiment, features common to the power amplification module 100A are not described and only different features are described. In particular, similar operations and advantages achievable by similar configurations are not individually described in the individual embodiments.

The power amplification module 100B further includes a filter circuit 140 in addition to the configuration of the power amplification module 100A.

The filter circuit 140 is located between the input terminal IN2 and the amplification path for the specific band in the low band, which is included in the 3G/4G chip 110, and performs a filtering process on the transmit signal RFlow'. Specifically, the filter circuit 140 performs filtering to attenuate the receive frequency band components of the transmit signal RFlow'. This can prevent amplification of the signal of the receive frequency band components, resulting in further reduction in the deterioration of reception sensitivity, compared to the power amplification module 100A.

The filter circuit 140 can be, for example, a bandpass filter that allows the transmit frequency band components of the transmit signal RFlow' to pass therethrough and that attenuates the receive frequency band components of the transmit signal RFlow'. Examples of the bandpass filter include, but are not limited to, a surface acoustic wave (SAW) filter.

Some illustrative embodiments of the present disclosure have been described. The power amplification modules 100A and 100B include, for a frequency band with a relatively narrow transmit/receive frequency interval, unlike the other frequency bands, the input terminal IN2, the power amplification circuit PA4 in the drive stage, and the attenuation circuit. This configuration makes it possible to amplify only the transmit frequency band components of the transmit signal RFlow' while attenuating the receive frequency band components included in the transmit signal RFlow'. This can prevent or reduce the occurrence of noise during power amplification of the transmit signal RFlow', and can prevent or reduce the deterioration of reception sensitivity.

Alternatively, the matching network MN4 located upstream of the power amplification circuit PA4 may serve as the attenuation circuit. This configuration can reduce noise without increasing the circuit scale.

The power amplification module 100B further includes the filter circuit 140 as an attenuation circuit. This configuration can further attenuate the receive frequency band components included in the transmit signal RFlow', resulting in further reduction in the deterioration of reception sensitivity.

The filter circuit 140 can be implemented as a bandpass filter. For example, the filter circuit 140 can be a SAW filter.

In addition, the power amplification modules 100A and 100B can have a greater emitter area of an HBT constituting the power amplification circuit PA4 than the emitter area of an HBT constituting the power amplification circuit PA3. This configuration can prevent or reduce noise in the power amplification of the transmit signal RFlow' while keeping the desired gain level for the power amplification of the transmit signal RFlow.

Additionally, the power amplification modules 100A and 100B include the switch elements SW1 and SW2. This configuration allows integration of input terminals for 2G and 3G/4G RF signals. Accordingly, the number of terminals can be reduced compared to when input terminals individually corresponding to communication standards are provided.

Additionally, the power amplification modules 100A and 100B can be configured such that the switch element SW2 is connected to the amplification path for the low band in the 2G chip 120 or electrically disconnects the input terminal IN1 during power amplification of the transmit signal RFlow'. This configuration can prevent noise from being supplied from the input terminal IN1 to the power amplification circuit PA5 in the 3G/4G chip 110 during amplification of the transmit signal RFlow'.

The embodiments described above are provided for easy understanding of the present disclosure, and it is not intended to limit the present disclosure to the embodiments only. Modifications and improvements can be made to the present disclosure without departing from the spirit of the present disclosure, and the equivalents thereof are also encompassed by the present disclosure. That is, these embodiments may be appropriately modified in design by those skilled in the art, and such modifications also fall within the scope of the present disclosure so long as the modifications include the features of the present disclosure. For example, the elements included in the embodiments described above and the arrangement, materials, conditions, shapes, sizes, and the like thereof are not limited to those described in the illustrated examples but can be modified appropriately. It is also to be understood that the embodiments described above are for illustrative purposes and partial substitutions or combinations of elements illustrated in different embodiments can be made, and such substitutions or combinations also fall within the scope of the present disclosure so long as the substitutions or combinations include the features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification module comprising:
    a first input terminal receiving a first transmit signal in a first frequency band;
    a second input terminal receiving a second transmit signal in a second frequency band having a narrower transmit/receive frequency interval than the first frequency band;
    a first amplification circuit receiving and amplifying the first transmit signal to produce a first amplified signal and outputting the first amplified signal;
    a second amplification circuit receiving and amplifying the second transmit signal to produce a second amplified signal and outputting the second amplified signal; and
    an attenuation circuit located between the second input terminal and the second amplification circuit and configured to attenuate a component of the second frequency band,
    wherein no attenuation circuit is located between the first input terminal and the first amplification circuit, wherein:
    the first and second frequency bands are between 699 MHz and 915 MHz.

2. The power amplification module according to claim 1, wherein the attenuation circuit operates to match an output impedance of a circuit located upstream of the second amplification circuit to an input impedance of the second amplification circuit.

3. The power amplification module according to claim 1, wherein the attenuation circuit comprises a bandpass filter attenuating the receive frequency band component of the second frequency band.

4. The power amplification module according to claim 3, wherein the bandpass filter comprises a surface acoustic wave filter.

5. The power amplification module according to claim 1, wherein the first amplification circuit comprises a transistor and the second amplification circuit comprises a transistor, and
    wherein the transistor of the second amplification circuit has a larger emitter area than the transistor of the first amplification circuit.

6. The power amplification module according to claim 1, further comprising:
    a fourth amplification circuit amplifying a third transmit signal conforming to a communication standard different from a communication standard to which the first transmit signal conforms; and
    a switch element outputting the first transmit signal or the third transmit signal inputted from the first input terminal to a corresponding one of the first amplification circuit and the fourth amplification circuit.

7. The power amplification module according to claim 6, wherein the switch element electrically disconnects the first input terminal and the first amplification circuit in a case where the second transmit signal is inputted to the second input terminal.

8. The power amplification module according to claim 2, wherein the attenuation circuit comprises a bandpass filter attenuating the receive frequency band component of the second frequency band.

9. The power amplification module according to claim 2, wherein the first amplification circuit comprises a transistor and the second amplification circuit comprises a transistor, and wherein the transistor of the second amplification circuit has a larger emitter area than the transistor of the first amplification circuit.

10. The power amplification module according to claim 3, wherein the first amplification circuit comprises a transistor and the second amplification circuit comprises a transistor, and
wherein the transistor of the second amplification circuit has a larger emitter area than the transistor of the first amplification circuit.

11. The power amplification module according to claim 4, wherein the first amplification circuit comprises a transistor and the second amplification circuit comprises a transistor, and
wherein the transistor of the second amplification circuit has a larger emitter area than the transistor of the first amplification circuit.

12. The power amplification module according to claim 2, further comprising:
a fourth amplification circuit amplifying a third transmit signal conforming to a communication standard different from a communication standard to which the first transmit signal conforms; and
a switch element outputting the first transmit signal or the third transmit signal inputted from the first input terminal to a corresponding one of the first amplification circuit and the fourth amplification circuit.

13. The power amplification module according to claim 3, further comprising:
a fourth amplification circuit amplifying a third transmit signal conforming to a communication standard different from a communication standard to which the first transmit signal conforms; and
a switch element outputting the first transmit signal or the third transmit signal inputted from the first input terminal to a corresponding one of the first amplification circuit and the fourth amplification circuit.

14. The power amplification module according to claim 4, further comprising:
a fourth amplification circuit amplifying a third transmit signal conforming to a communication standard different from a communication standard to which the first transmit signal conforms; and
a switch element outputting the first transmit signal or the third transmit signal inputted from the first input terminal to a corresponding one of the first amplification circuit and the fourth amplification circuit.

15. The power amplification module according to claim 5, further comprising:
a fourth amplification circuit amplifying a third transmit signal conforming to a communication standard different from a communication standard to which the first transmit signal conforms; and
a switch element outputting the first transmit signal or the third transmit signal inputted from the first input terminal to a corresponding one of the first amplification circuit and the fourth amplification circuit.

16. The power amplification module according to claim 1, wherein the attenuation circuit and the first amplification circuit are fabricated in a monolithic microwave integrated circuit.

17. The power amplification module according to claim 2, wherein the attenuation circuit and the first amplification circuit are fabricated in a monolithic microwave integrated circuit.

18. The power amplification module according to claim 3, wherein the attenuation circuit and the first amplification circuit are fabricated in a monolithic microwave integrated circuit.

19. The power amplification module according to claim 1, wherein the attenuation circuit is mounted in the module.

20. The power amplification module according to claim 2, wherein the attenuation circuit is mounted in the module.

* * * * *